(12) United States Patent
Yekutiely

(10) Patent No.: US 9,045,276 B2
(45) Date of Patent: Jun. 2, 2015

(54) FLOATING ANCHOR CURB SYSTEM

(71) Applicant: Barak Yekutiely, Kochav Yair (IL)

(72) Inventor: Barak Yekutiely, Kochav Yair (IL)

(73) Assignee: Aquate Group Ltd., Afek Industrial Park, Rosh Haayin (IL)

( * ) Notice: Subject to any disclaimer, the term of this patent is extended or adjusted under 35 U.S.C. 154(b) by 0 days.

(21) Appl. No.: 13/938,241

(22) Filed: Jul. 10, 2013

(65) Prior Publication Data

US 2015/0016889 A1  Jan. 15, 2015

(51) Int. Cl.
*B65D 88/34* (2006.01)
*H01L 31/042* (2014.01)

(52) U.S. Cl.
CPC ............... *B65D 88/34* (2013.01); *H02S 20/00* (2013.01)

(58) Field of Classification Search
CPC ................................ E03B 11/00; E03F 5/105
USPC ............ 405/52, 53, 63; 4/498–500; 220/216; 210/170.05
See application file for complete search history.

(56) References Cited

U.S. PATENT DOCUMENTS

| | | | | |
|---|---|---|---|---|
| 3,313,443 A * | 4/1967 | Dial et al. | | 220/219 |
| 3,330,118 A * | 7/1967 | Biais | | 405/53 |
| 3,736,754 A * | 6/1973 | Azalbert et al. | | 405/53 |
| 4,000,527 A * | 1/1977 | Gannon | | 4/499 |
| 4,079,726 A * | 3/1978 | Voelker | | 126/566 |
| 6,932,540 B2 * | 8/2005 | Svirklys et al. | | 405/52 |
| 2002/0131822 A1 * | 9/2002 | Hill | | 405/52 |
| 2007/0283999 A1 * | 12/2007 | Yekutiely et al. | | 136/259 |
| 2009/0242566 A1 * | 10/2009 | Witheridge | | 220/495.01 |

* cited by examiner

*Primary Examiner* — Tara M. Pinnock

(74) *Attorney, Agent, or Firm* — Dekel Patent Ltd; David Klein

(57) ABSTRACT

A floating anchor curb system includes a floating cover for spreading over a body of water and one or more floating anchor curbs over which the floating cover is placed. Each of the floating anchor curbs includes one or more hollow chambers partially fillable with a ballast liquid to form a ballast.

8 Claims, 4 Drawing Sheets

FLOATING ANCHOR CURB SYSTEM

FIELD OF THE INVENTION

The present invention relates generally to floating cover systems, and particularly to a floating anchor curb for use with floating cover systems.

BACKGROUND OF THE INVENTION

Reference is made to FIGS. 1A and 1B, which illustrate a typical prior art weighted sump floating cover system, respectively shown full and empty.

Floating covers are typically governed by the AWWA (American Water Works Association) standard D130 and AWWA Manual M25, entitled "Flexible-Membrane Covers and Linings for Potable Water Reservoirs".

A floating cover 1 is placed over a reservoir or other body of water 2. The perimeter of the floating cover is attached to perimeter anchor curbs 3 using batten bars 4 and fasteners as per AWWA M25 standard on page 11. Different floating ballasts 5 with weighted tubes 6 may be placed at different locations on the floating cover 1.

Quoting from AWWA D130 page 11: "Cover design should include considerations such as wind stability and a rainwater removal system. It should also include details on the float layout, sump locations, access hatches, and attachment of the cover at the perimeter and at all penetrations . . . Floating reservoir covers are usually attached to the top of the reservoir above maximum overflow level by means of corrosion resistant batten bars, fasteners, and a vulcanized rubber cushion strip."

SUMMARY OF THE INVENTION

The present invention seeks to provide a floating anchor curb system for water reservoirs, as is explained more in detail hereinbelow. The invention provides a unique floating anchor curb that augments or even replaces the peripheral anchor curbs of the prior art, and provides significant advantages over the prior art. The system and method of assembly and installation have advantages over the prior art, such as standalone floating covers and floating covers with photovoltaic (PV) cell systems that are placed over water bodies.

One advantage of the floating anchor curb is the possibility of dynamic location; the floating anchor curb can be positioned at any location on a body of water. The invention enables installing a continuous floating cover not just to the perimeter of a body of water but even on an internal portion of the body of water without being attached to peripheral stationary anchor curbs.

Another advantage of the floating anchor curb is an unlimited range of sizes and shapes. The floating anchor curb can be of any size and shape and can be segmented or spaced in parallel rows to accommodate virtually any size and geometry of continuous floating covers to span very large water bodies that otherwise could not be covered with a floating cover.

Another advantage of the floating anchor curb is dynamic ballasting. In contrast to prior art ballasts made of concrete with a fixed weight, the floating anchor curb can be filled with water or other liquid in various amounts to secure against various wind uplift and forces on the cover in various environmental conditions. The mass and buoyancy of the floating anchor curb's dynamic ballasting system can be modified manually or by a closed-loop control system with sensors that sense weight and float conditions (among other factors) and operate with a controller that can pump in more liquid to the ballast or pump liquid out to adapt to the situation. In this manner, the invention can adapt to extreme weather conditions and changes in the loading weight on the system.

In the embodiment with the control system, the dynamic ballasting may include a solar tracker system. The dynamic ballasting of the floating anchor curb operates in conjunction with a solar sensor so that adjacent floating anchor curbs can be tilted at an inclination angle so as to increase the energy output from the PV panels that are on the PV frame.

Another advantage of the floating anchor curb is the creation of a dynamic water channel. In the prior art, continuous floating covers have a large span between the perimeter anchor curbs and thus water may puddle on parts of the cover. In contrast, in the present invention, the span between parallel floating anchor curbs can be much smaller and thus can create a water channel that improves water flow back into the reservoir and prevents creation of puddles.

Another advantage of the floating anchor curb is its ease of installation. The floating anchor curb serves as a continuous flat work area for seaming together continuous floating cover membranes in a dry installation over non-level areas as well as on the water. The floating anchor curb enables making fast field quality shop seams as opposed to field seams that are of less quality and which take longer to make. The floating anchor curb also functions as a walkway path for ease of maintenance to reach any part of the floating cover.

Another advantage of the floating anchor curb is that is can serve a dualfunction—ballast plus support for a PV modules rack with the addition of a batten frame. The batten frame secures the membrane (floating cover) to the floating anchor curb, which may be done in a manner similar to a batten bar that secures a membrane to the peripheral concrete anchor curb. The batten frame doubles as a PV frame or part of a PV frame or rack to secure PV modules.

There is provided in accordance with an embodiment of the invention a floating anchor curb system including a floating cover for spreading over a body of water, and one or more floating anchor curbs over which the floating cover is placed, wherein each of the floating anchor curbs includes one or more hollow chambers partially fillable with a ballast liquid to form a ballast.

Non-limiting embodiments of the invention may include one or more of the following features.

The floating cover is attached to the floating anchor curb with a batten bar or frame and fastener. A periphery of the floating cover can be attached to stationary anchor curbs with batten bars and fasteners.

A span between adjacent floating anchor curbs creates a water channel for water to flow back into the body of water.

One or more photovoltaic panels are attached to the floating anchor curbs.

The ballast includes a dynamic ballasting system. The dynamic ballasting system includes one or more sensors that sense operating conditions and operate with a controller that controls a pump to pump in more liquid to the ballast or pump liquid out of the ballast. The controller is inside one of the floating anchor curbs or is remote from the floating anchor curbs. The dynamic ballasting system further includes a solar tracker system for tracking a position of the sun and the dynamic ballasting system is operative to tilt the floating anchor curbs in accordance with sensed information from the solar tracker system.

BRIEF DESCRIPTION OF THE DRAWINGS

The present invention will be understood and appreciated more fully from the following detailed description taken in conjunction with the drawings in which.

DETAILED DESCRIPTION OF EMBODIMENTS

Figure 1A:
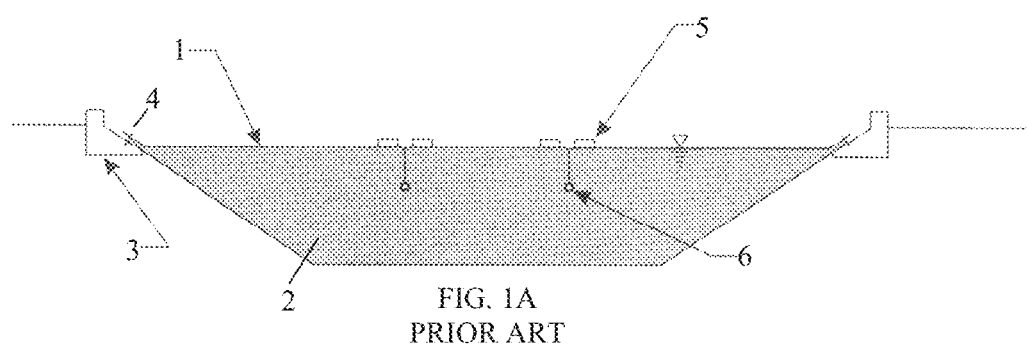
FIGS. 1A and 1B are simplified illustrations of a prior art weighted sump floating cover system.
Figure 1B:
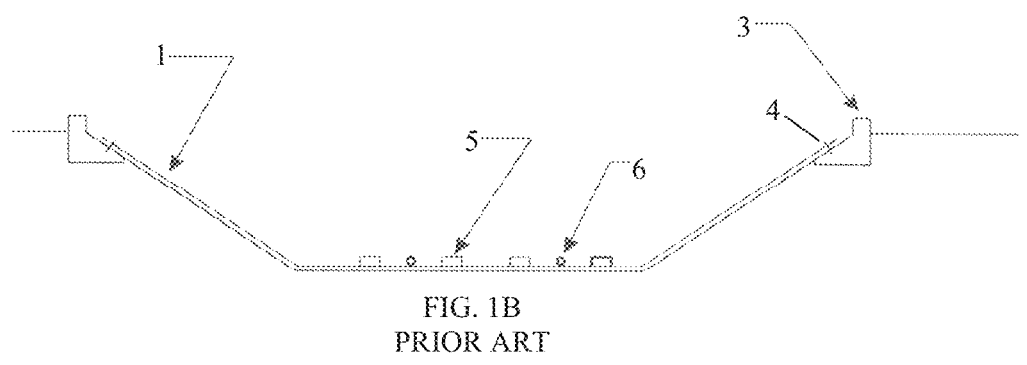
Figure 2:
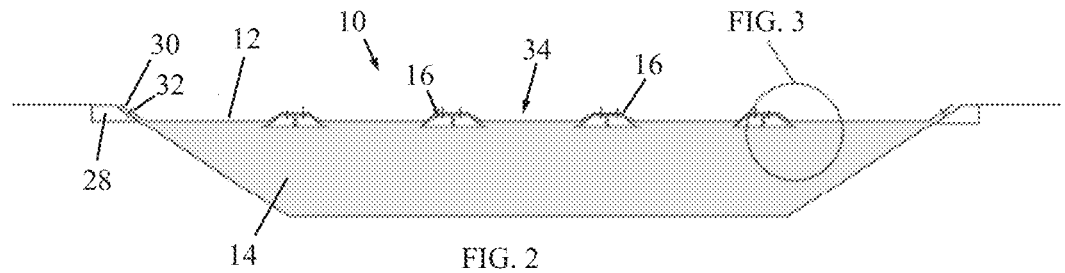
FIG. 2 is a simplified illustration of a floating anchor curb system, constructed and operative in accordance with an embodiment of the present invention.

Reference is now made to FIG. 2, which illustrates a floating anchor curb system 10, constructed and operative in accordance with a non-limiting embodiment of the present invention.

Floating anchor curb system 10 includes a floating cover (membrane, the terms being used interchangeably) 12 which is spread over a body of water 14, such as a reservoir (the terms being used interchangeably). The floating cover 12 is placed over and attached to one or more floating anchor curbs 16.

Figure 3:
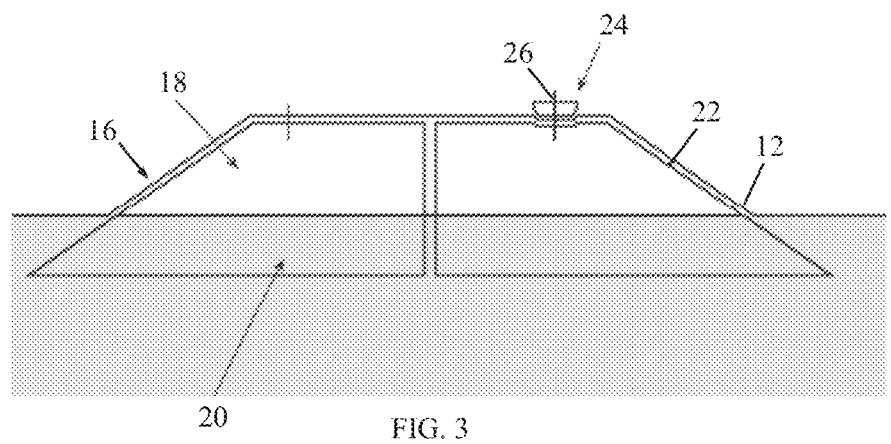
FIG. 3 is a more detailed illustration of the floating anchor curb.

As seen in FIG. 3, floating anchor curb 16 includes one or more hollow chambers 18 which may be partially filled with a ballast liquid (typically water) so as to form a ballast 20. The floating anchor curb 16 may be of any size and shape and may have sloping sides 22. Floating cover 12 is attached to floating anchor curb 16 with a batten bar or frame 24 and fasteners 26 (e.g., threaded anchor bolts), such as per the AWWA M25 standard. Floating anchor curbs 16 may be made of any durable material, such as but not limited to, plastic, metal, concrete or wood.

As seen in FIG. 2, the periphery of floating cover 12 may be attached to stationary anchor curbs 28 with batten bars 30 and fasteners 32. As mentioned above, the span between adjacent (parallel or not parallel) floating anchor curbs 16 creates a water channel 34 that improves water flow back into the reservoir 14 and prevents creation of puddles.

Figure 4:
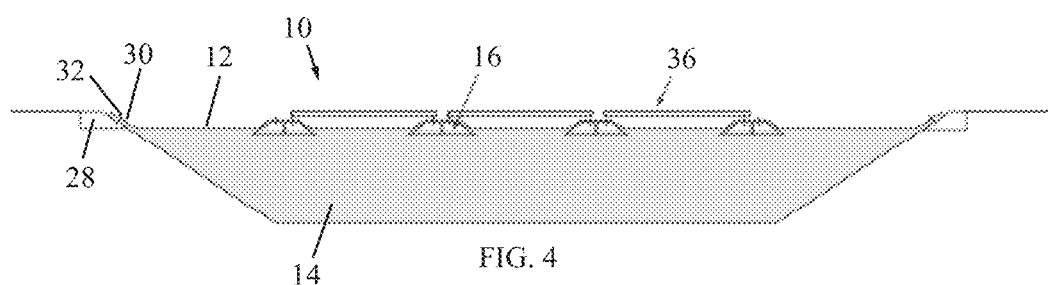
FIG. 4 is a simplified illustration of a floating anchor curb system with photovoltaic panels, constructed and operative in accordance with an embodiment of the present invention.
Figure 5:
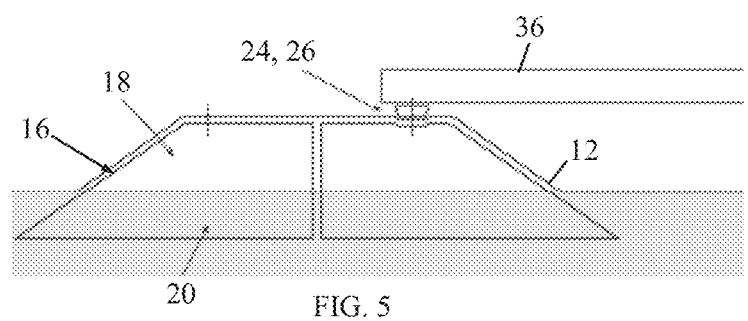
FIG. 5 is a more detailed illustration of the floating anchor curb with the photovoltaic panel attached to it.

Reference is now made to FIGS. 4 and 5, which illustrate floating anchor curb system 10 with one or more photovoltaic panels 36, in accordance with an embodiment of the present invention. The photovoltaic panel 36 may be attached to the batten frame 24 with fasteners (fasteners 26 or other fasteners). The addition of the photovoltaic panels 36 creates a WIPV (Water Integrated Photovoltaic) system, that is, a photovoltaic covering for the reservoir 14 that solar generates electrical power for various applications, as is described in PCT Patent Application PCT/IL2007/000567. Such a WIPV system integrated with the floating anchor curb system 10 protects precious clean water sources from evaporation and provides a large-scale, environmentally-friendly and efficient system for water creation, water delivery, water rehabilitation or water treatment without requiring any onsite energy.

Figure 6:
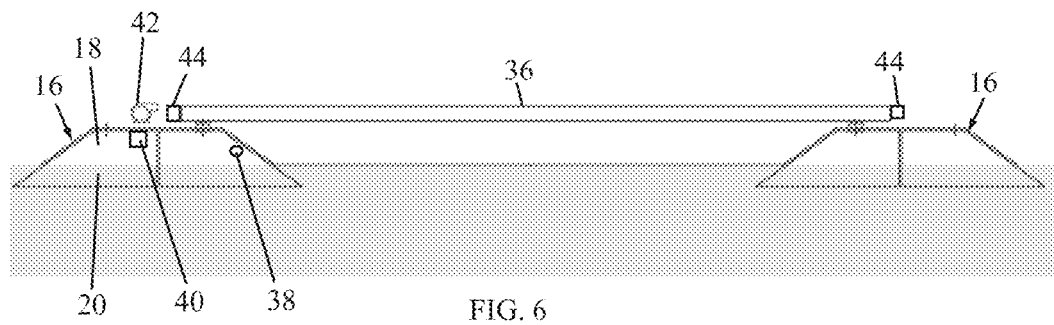
FIGS. 6 and 7 are simplified illustrations of a floating anchor curb system with solar tracker for the photovoltaic panels, constructed and operative in accordance with an embodiment of the present invention, respectively before and after tilting the photovoltaic panels.
Figure 7:
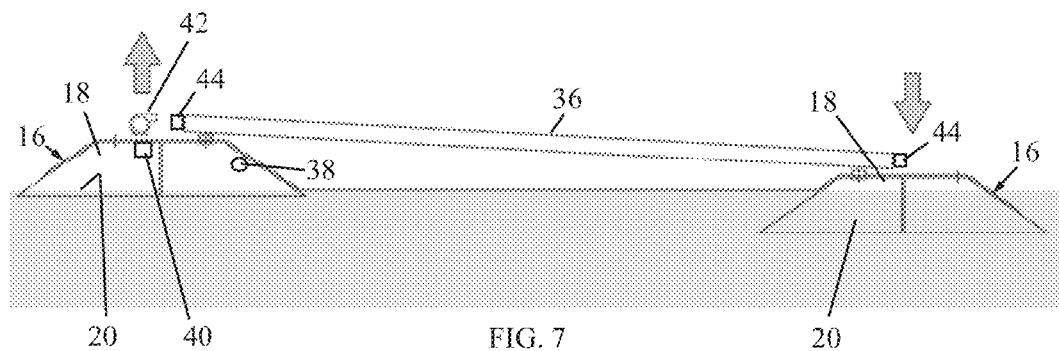

Reference is now made to FIG. 6. The ballast 20 may be a dynamic ballasting system. In such an embodiment, the weight (mass) and buoyancy of the dynamic ballasting system can be modified manually or by a closed-loop control system. The control system includes one or more sensors 38 (e.g., load cells, clinometers and other sensors) that sense weight and float conditions (among other factors) and operate with a controller 40 that controls a pump 42 to pump in more liquid to the ballast 20 or pump liquid out of ballast 20 to adapt to the situation. (Controller 40 is shown inside floating anchor curb 16, but can be outside or even off-site and remote.) The control system can further include a solar tracker system 44, which may include a photocell or other suitable solar sensor that tracks the position of the sun. The dynamic ballasting of the floating anchor curb 16 operates in conjunction with solar tracker system 44 so that adjacent floating anchor curbs 16 can be tilted at an inclination angle (see FIG. 7) so as to increase the energy output from the PV panels 36 that are on the PV frame. Controller 40 controls pump 42 to pump in more liquid to the ballast 20 so as to tilt the PV panel 36. The solar tracker can be mounted off shore and in wireless communication with the controller.

Thus, the floating anchor curb ballast 20 serves as fixed or dynamic ballast for the PV system against wind uplift forces. It is noted that this has the advantage of allowing the PV to incline at a larger angle (for increased power generation and air cooling without wind breakers) than would be allowed or practical for flat rooftop ballasted PV systems, which are limited to a small angle and also have wind breakers to limit the amount of ballasting.

The floating anchor curb, when used as a support for PV with dynamic ballasting and solar tracking, provides a very robust, reliable and low-cost solar tracking solution for both single-axis and dual-axis solar tracking without any mechanical parts that can wear. This is advantageous over prior art types of solar tracking systems.

Figure 8:
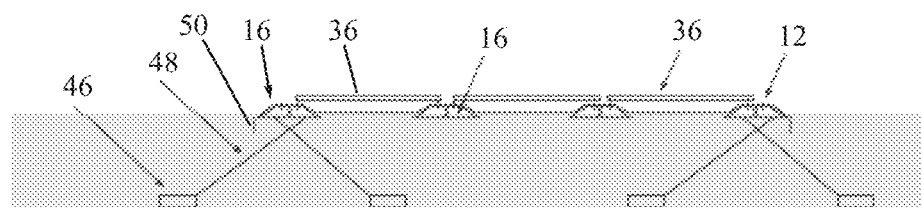
FIGS. 8, 9 and 10 are simplified illustrations of a floating anchor curb system with tensioning and stationary anchors, in accordance with three different embodiments of the present invention.
Figure 9:
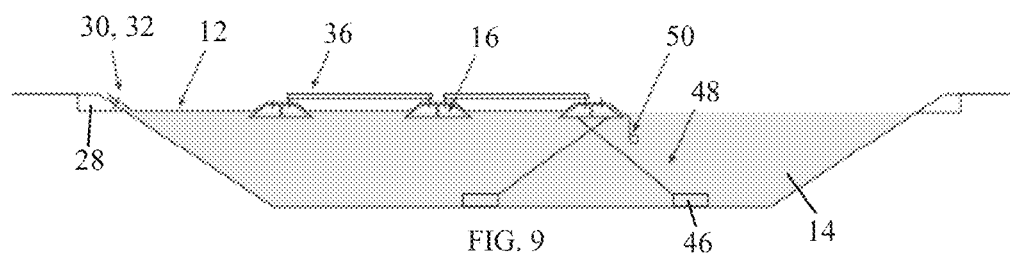
Figure 10:
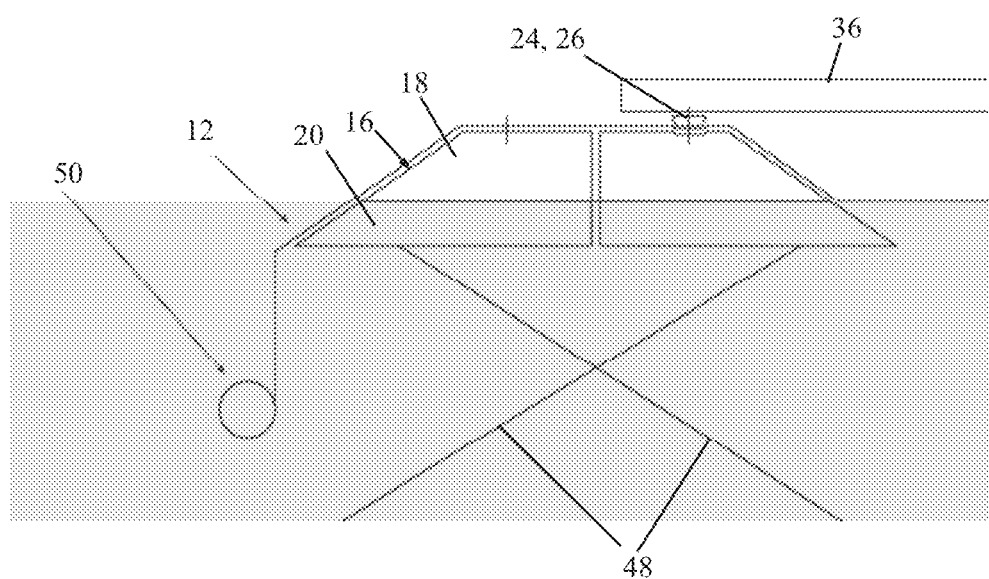

Reference is now made to FIGS. 8, 9 and 10, which illustrate the floating anchor curb system 10 with optional anchoring of the floating anchor curbs 16 to stationary submerged anchors 46 (which may be made of concrete). Floating anchor curbs 16 may be attached to stationary submerged anchors 46 by means of tensioning members 48. Floating anchor curbs 16 may be weighted by weight tubes 50.

What is claimed is:

1. A floating anchor curb system comprising:
a floating cover for spreading over a body of water; and
one or more floating anchor curbs over which said floating cover is placed, wherein each of said floating anchor curbs comprises one or more hollow chambers partially fillable with a ballast liquid to form a ballast, wherein said ballast comprises a dynamic ballasting system that comprises one or more sensors that sense operating conditions and operate with a controller that controls a pump to pump a ballast liquid to said ballast or pump a ballast liquid out of said ballast and a solar tracker system for tracking a position of the sun and said dynamic ballasting system is operative to tilt said floating anchor curbs in accordance with sensed information from said solar tracker system.

2. The system according to claim 1, wherein said floating cover is attached to said floating anchor curb with a batten bar or frame and fastener.

3. The system according to claim 1, wherein a periphery of said floating cover is attached to stationary anchor curbs with batten bars and fasteners.

4. The system according to claim 1, wherein a span between adjacent floating anchor curbs creates a water channel for water to flow back into a body of water.

5. The system according to claim 1, further comprising one or more photovoltaic panels attached to said floating anchor curbs.

6. The system according to claim 1, wherein said controller is inside one of said floating anchor curbs.

7. The system according to claim 1, wherein said controller is remote from said floating anchor curbs.

8. The system according to claim 1, wherein said floating anchor curbs are attached to stationary submerged anchors.

* * * * *